(12) United States Patent
Vaughn et al.

(10) Patent No.: US 7,907,030 B2
(45) Date of Patent: Mar. 15, 2011

(54) INTEGRATED CIRCULATORS SHARING A CONTINUOUS CIRCUIT

(75) Inventors: Todd Vaughn, Lawrenceville, GA (US); David Popelka, Roswell, GA (US); John D. Voss, Cumming, GA (US)

(73) Assignee: EMS Technologies, Inc., Norcross, GA (US)

( * ) Notice: Subject to any disclaimer, the term of this patent is extended or adjusted under 35 U.S.C. 154(b) by 491 days.

(21) Appl. No.: 11/314,160

(22) Filed: Dec. 19, 2005

(65) Prior Publication Data
US 2006/0139118 A1 Jun. 29, 2006

Related U.S. Application Data

(60) Provisional application No. 60/636,945, filed on Dec. 17, 2004.

(51) Int. Cl.
*H01P 1/387* (2006.01)
(52) U.S. Cl. ......................................... 333/1.1; 333/24.2
(58) Field of Classification Search .................... 333/1.1, 333/24.2
See application file for complete search history.

(56) References Cited

U.S. PATENT DOCUMENTS

| | | | |
|---|---|---|---|
| 3,334,317 A * | 8/1967 | Andre | 333/1.1 |
| 3,636,479 A | 1/1972 | Hartz et al. | |
| 3,739,302 A | 6/1973 | McManus | |
| 3,854,106 A * | 12/1974 | Tresselt | 333/1.1 |
| 4,761,621 A | 8/1988 | Kane et al. | |
| 4,821,007 A | 4/1989 | Fields et al. | |
| 5,177,456 A | 1/1993 | Stern et al. | |
| H1408 H | 1/1995 | Babbitt et al. | |
| 5,886,587 A | 3/1999 | Sturdivant | |
| 6,563,394 B1 | 5/2003 | Kudo | |
| 6,566,972 B2 | 5/2003 | Paquette et al. | |
| 6,611,180 B1 | 8/2003 | Puzella et al. | |
| 6,633,205 B2 | 10/2003 | Jussaume et al. | |

(Continued)

FOREIGN PATENT DOCUMENTS

JP     59008403 A     1/1984

(Continued)

OTHER PUBLICATIONS

WIPO PCT Search Report Conducted by and Written Opinion Prepared by The European Patent Office For PCT Application No. PCT/US2005/046164 dated Apr. 20, 2006.

*Primary Examiner* — Stephen E Jones
(74) *Attorney, Agent, or Firm* — Troutman Sanders LLP; Robert R. Elliott, Jr.

(57) ABSTRACT

The present invention is directed to a circuit assembly that includes an integrated circulator assembly. The circuit assembly has a first substrate, which contains a continuous circuit trace that includes a circulator component from the circulator assembly and at least one electrical component from the circuit assembly. A second substrate is disposed beneath the first substrate and includes a cladding on one surface. The second substrate contains an aperture that accepts a ferrite element, which is axially aligned with the circulator component of the circuit trace. A conductive material is placed across the ferrite element so that it forms a continuous ground plane with the cladding, which is common to the entire circuit trace. The circulator assembly also contains a magnet bonded to the ferrite element. The circulator assembly may also include a yoke disposed below the magnet to shield the circulator from external magnetic fields.

12 Claims, 14 Drawing Sheets

U.S. PATENT DOCUMENTS

| | | |
|---|---|---|
| 6,707,417 B2 | 3/2004 | Huettner et al. |
| 6,741,478 B2 | 5/2004 | Shimizu et al. |
| 6,750,731 B2 | 6/2004 | Emanuelsson |
| 6,822,524 B2 | 11/2004 | Hempel et al. |
| 6,914,496 B2 | 7/2005 | Tanaka |
| 6,917,250 B2 | 7/2005 | Lombardi et al. |
| 2002/0089388 A1 | 7/2002 | Lingel et al. |
| 2004/0000958 A1 | 1/2004 | Lingel |
| 2004/0145424 A1 | 7/2004 | Jocher |
| 2005/0007206 A1 | 1/2005 | Kocharyan |
| 2005/0093641 A1 | 5/2005 | Lombardi et al. |
| 2005/0110591 A1 | 5/2005 | Martin et al. |

FOREIGN PATENT DOCUMENTS

| | | |
|---|---|---|
| JP | 08204408 | 9/1996 |
| JP | 2000201007 A | 7/2000 |

* cited by examiner

INTEGRATED CIRCULATORS SHARING A CONTINUOUS CIRCUIT

REFERENCE TO RELATED APPLICATIONS

This application claims priority to U.S. Provisional Patent Application Ser. No. 60/636,945, filed on Dec. 17, 2004, which is herein incorporated by reference.

BACKGROUND

The use of circulators to isolate and transmit electronic signals is well known. Circulators are multi-port devices, which receive a radio frequency (RF) signals on one port and route them to an adjacent port while isolating or decoupling the RF signal from the remaining ports. Currently, circulators are used for applications that operate at very high frequencies. For example, circulators are commonly used in microwave circuits and microwave transmit and receive (T/R) modules for both RADAR and communications systems. Conventional circulator designs may include a y-shaped RF conductor with three port connectors that are positioned between a pair of ferrite substrates. Magnets are placed above and below the ferrite substrates to produce a DC-biasing magnetic field in the ferrite elements to provide non-reciprocal operation of the transmission paths between the three port connectors. A thin metal plate, or cladding, is placed on the outer surface of each ferrite substrate below each magnet to provide ground planes for the circulator and provide shielding from spurious RF radiation. The components are then placed within a steel case or housing to hold provided a return path for the magnetic fields generated by the magnets, while at the same time shielding the components from extraneous magnetic fields.

Although circulators are extremely efficient devices, conventional circulators have several drawbacks. First, installation of conventional circulators on a circuit board requires that an aperture, which is slightly larger than the circulator package is cut into the circuit board where the circulator is to be installed. The circulator is then placed within the aperture and the port connectors are attached to the external circuit trace on the circuit board using manual interconnection, such as solder, ribbon cables, and the like. Since the port connectors of the circulator are normally are made from different materials and have different impedance values from the circuit trace on the circuit board, there is an impedance mismatch at the interconnects, which result is a degradation of the electrical performance of the circulator. The impedance mismatch must be corrected using ribbon connectors, or other known methods to match the impedance the port connectors with the circuit trace. Additionally, discontinuities between the circulator and the circuit trace exist at the connection ports. The manual interconnects also lead to insertion losses at the port connectors, an increase in the interference from unwanted RF signals, and high performance variability of the circulator. Furthermore, the manual interconnects tend to have poor thermal capabilities, which can lead to a decrease in the amount of signal power that can be passed through the circuit.

Another drawback with conventional circulators is that the circulators doe not lie within the same plane as the components of the external circuit. This makes it difficult to effectively provide a common ground the circulator and the circuit. Typically a metal plate must be molded to conform to the contours created by the circulator and adhered to the backside of both the circulator and the external circuit. This non-planar ground plane can lead to reduction in the electrical performance of the circulator.

Yet another drawback to conventional circulators is that they are expensive to manufacture and cannot be made using an automated manufacturing process. For example, the ferrite substrates used in conventional circulators tend to be brittle and can be damaged in an automated manufacturing process. In addition, the components, particularly the resonator, the ferrite elements, and the magnets must be precisely aligned to insure proper operation of the circulator. Consequently, all or at least part of conventional circulators must be assembled manually and the component aligned using a jig or and aligning frame. Once the components are properly aligned, they are sealed, usually by hand, in a steel housing. A spring or other compression mechanism is usually placed in the housing to insure that the ferrite material remains in constant contact with the resonator. Unfortunately, this assembly process is expensive in both time and money.

Several attempts have been made to solve these problems associated with conventional circulators. For example, one method attempted to reduce impedance mismatch between two or more circulator by cascading the circulators in a common package. The circulator includes two or more RF conductors cascaded together, which are disposed between two oblong ferrite substrates. A single impedance matching element is coupled between the coupled connection ports of the cascaded circulator resonators to improve the performance of the circulators. Unfortunately this method still must use manual interconnects to connect the cascaded circulators to an exterior circuit. Furthermore, the circulator elements are disposed between two ferrite substrates, which are easily damaged.

Another solution was to design a cost effective method of manufacturing a large number of circulators. The method includes depositing a circulator trace on a central dielectric substrate. A series of dielectric shims, which are pre-drilled with an opening are disposed around a ferrite element, which rests on top each side of the central substrate. A steel plate is then placed on each side of the substrate layer. An outer shim then is placed on top of the steel disc. The outer shim contains a number of vias etched down to the steel plate to provide an electrical contact to ground. A number of vias are then drilled into the outer shim and filled with a conductive material to provide contacts for surface mounting the circulator to a circuit board. Although the method uses inexpensive materials, this circulator has several drawbacks. First, the steel disc covers only a portion of the circulator trace, which provides an inadequate ground for the circulator trace and consequently does not adequately shield the circulator trace from spurious RF signals. Furthermore, since the circulator is designed for surface mounting, the circulator does not lie in-line with the external circuit and therefore, the ground plane of the circuit is non-planar and discontinuous. The ground plane between the external circuit and the circulator must be bridged with ribbon cables, or other suitable connectors, which results in electrical inefficiencies. Moreover, since the circulator is surface mounted, it uses manual interconnects to connect the circulator to the external circuit, which result in an impedance mismatch between the circulator and the external circuit.

Therefore, there is a need in the art for a low cost circulator that uses standard dielectric materials that can be assembled using conventional printed circuit board (PCB) techniques. There is a further need in the art for a circulator that can be integrated into a circuit, in which the circuit trace of the circulator and the trace of the electrical circuit are part of the same continuous circuit trace without the use of manual interconnects. There is still a further need for a circulator that has a continuous ground plane and can be inserted into a circuit board so that the circulator trace is in-line with the trace of the components from the external circuit.

SUMMARY

The present invention meets the needs described above in a circulator that utilizes a unique multi-layer configuration that includes a continuous circuit trace on a non-ferrous dielectric substrate. The unique construction may be use to create a circulator in either a microstrip configuration or a stripline configuration. Generally described, the present invention is directed toward a multi-layer circulator that has a first substrate, which contains a continuous circuit trace that includes a circulator component. A second substrate is disposed beneath the first substrate and includes a cladding or a metallized surface. The second substrate contains an aperture that accepts a ferrite element, which is axially aligned with the circulator component of the circuit trace. A conductive material is placed across the ferrite element so that it is in electrical contact with the cladding of the second substrate to complete the continuous ground plane. The circulator also contains a magnet bonded to the conductive material to produce the desire magnetic field for the operation of the circulator. The circulator may also include a yoke disposed below the magnet to shield the circulator component from unwanted external magnetic fields.

More particularly described, the first substrate that contains the circuit trace is composed of a homogeneous dielectric material, while the second substrate is composed of a dielectric material. For instance, the first substrate may be made from any homogeneous non-ferrous material that is used to manufacture conventional printed circuit boards (PCBs), such as polytetrafluoroethylene (PTFE), combinations of PTFE and woven glass fibers, PTFE and random micro fiber glass, PTFE and ceramic, polyamides and polyamide compositions including polyamide and glass, polyamide film, epoxy resins, such as cyanate ester, bisamalemide tiazine, and the like. The second substrate may also be made form any of these conventional materials, but may also be made of a combination of two or more these dielectric materials.

The conductive material that is placed across the ferrite element and in electrical contact with the cladding is made from a conductive adhesive that not only completes the ground plane but also bonds the elements of the circulator together. In one instance, the conductive material a thin film adhesive that is laid across the ferrite element. The conductive thin film adhesive typically has a thickness of approximately 0.0008 inches to 0.0015 inches, and more particularly approximately 0.001 inches. The conductive thin film adhesive is slightly larger than the aperture and the ferrite element so that is completely covers and aperture to forma a substantially planar ground plane across the entire circuit trace. Alternatively, the conductive material may be made from a conductive two-part epoxy that is applied across the ferrite element in a softened state and allowed to cure.

The first substrate is relatively thin as compared to the second substrate. Typically the first substrate has a thickness in the range of approximately 0.003 inches to 0.007 inches, while the second substrate has a thickness in the range of approximately 0.03 inches to 0.07 inches. Therefore, the first substrate has a thickness that is approximately an order of magnitude thinner than the second substrate.

In addition to the circulator being formed in a microstrip configuration, the circulator may also be formed in a stripline configuration. The stripline circulator has the same configuration as the microstrip circulator; however, the circulator also contains a third substrate disposed above the first substrate. The third substrate is composed of the same dielectric material as the second substrate and has a cladding covering at least one side to provide a second ground plane. The third substrate also contains an aperture that contains a second ferrite element that is proximately aligned above the circulator component. A second piece of the conductive material is disposed above the ferrite element. The conductive material again is slightly larger than the aperture and is in electrical contact with the cladding of the third substrate to for a second substantially planar ground plane. A second magnet is located above the second ferrite element in the third substrate.

The stripline circulator may also contain a yoke that has a first plate bonded to the top of the magnet on the third substrate and a bottom plate that is bonded to the underside of the first magnet disposed beneath the second substrate.

The present invention is also directed to a microstrip circuit assembly containing an integrated circulator assembly. The stripline circuit assembly contains a first substrate that has a continuous circuit trace, wherein the continuous circuit trace has at least one circulator element electrically connected to at least one other electronic element. A second substrate is disposed below the first substrate. The second substrate also contains a ferrite element disposed within an aperture that is proximately aligned with the circulator component. A conductive material is disposed below the ferrite disc and in electrical contact with a cladding on the bottom surface of the second substrate, thereby forming a substantially planar ground plane that is continuous over the entire circuit trace. A magnet is disposed below the ferrite element of the second substrate. The circuit may also contain a yoke disposed below the magnet to shield the circulator component from the extraneous magnetic fields and also to provide a return path for the internal magnetic field.

The first substrate of the circuit is typically made from a non-ferrous dielectric material and is relatively thin. Typically, the first substrate has a thickness in the range of approximately 0.003 inches and 0.007 inches, and more particularly about 0.005 inches. The second substrate is also made from a dielectric material. However the second substrate is thicker than the first substrate and has a thickness in the range of approximately 0.03 inches to 0.07 inches, and more particularly about 0.05 inches.

The present invention may also be directed to a stripline circuit that contains a circulator component integrated with at least one other electronic component in a continuous circuit trace. The stripline circuit is identical to the microstrip circuit described above; however, the stripline circulator also contains a third substrate disposed above the first substrate. The third substrate also contains an aperture that is proximately aligned with the circulator component. A second ferrite element is inserted into the second aperture and a conductive material is used to cover the ferrite element and make electrical contact with a cladding on the exterior surface of the third substrate. The conductive material is in electrical contact with the cladding forms a substantially planar ground plane, which is continuous across the entire circuit trace. The stripline circuit also contains a magnet positioned above and in proximal alignment with the ferrite element.

The circulator assembly may also include a yoke to shield the circulator component from any unwanted external magnetic fields and also to provide a return path for the internal magnetic field created by the magnets through the ferrite elements. The yoke is comprised of a top plate positioned on top of the magnet located above the third substrate and a bottom plate positioned below the magnet located below the second substrate. In addition the yoke may have at least one tang connecting the top plate to the bottom plate.

The present invention may also include a method for creating a microstrip circulator. The method includes first creating a continuous circuit trace that includes at least one circulator component on a first substrate, which is made from a non-ferrous dielectric material. Next, a laminar stack is created by placing a second substrate that is metallized on the exterior surface. The second substrate contains an aperture, which is aligned with the circulator component of the continuous circuit trace. A ferrite element is then inserted into the aperture and a conductive material is place over the ferrite material. Typically the conductive material is a conductive thin film adhesive which is helps hold the ferrite element in the aperture. However, since the thin film adhesive is conductive, it makes electrical contact with the metallized surface of the second substrate and forms a continuous ground plane across the entire circuit trace. Since the conductive film adhesive is relatively thin, the ground plane is also substantially continuous across the entire circuit trace. Once the stack is assembled, the laminar stack is co-bonded by heating the stack at an elevated temperature. Prior to co-bonding the laminar stack together, a yoke may be attached to the magnet using the conductive adhesive.

The method can also be extended to include manufacturing stripline circulators. The same method is followed for creating the microstrip circulator; however, a third substrate is placed on top of the first substrate, which also contains an aperture that is aligned with the circulator component of the continuous circuit trace. A second ferrite element is then inserted into the aperture in the third substrate and a conductive a conductive thin film adhesive is laid across the top of the second ferrite element and makes electrical contact with the metallized surface of the third substrate and forms a second continuous ground plane across the entire circuit trace. Since the conductive film adhesive is relatively thin, the ground plane is also substantially planar across the entire circuit trace. The laminar stack is then co-bonded together.

The various aspects of the present invention may be more clearly understood and appreciated from a review of the following detailed description of the disclosed embodiments and by reference to the appended drawings and claims.

DETAILED DESCRIPTION OF THE EMBODIMENTS

Figure 1A:
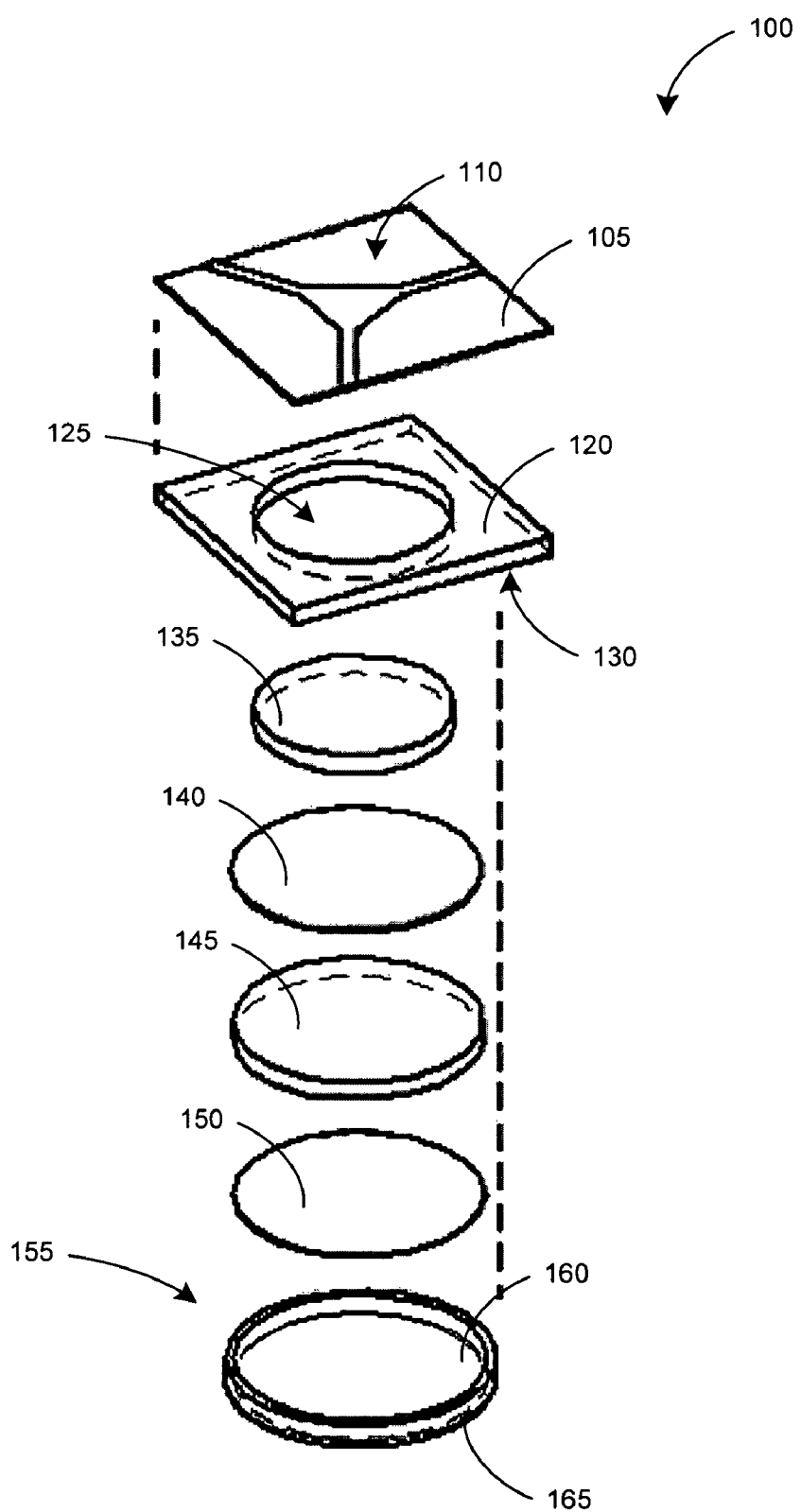
FIG. 1A is an illustration of an exploded view of a circulator assembly for use with a microstrip circuit in accordance of the present invention.

Referring now to the figures in which like element have like numerals throughout the figures, FIG. 1A is an exploded view of a circulator assembly 100 in accordance with some embodiments of the present invention. The circulator assembly 100 contains a single ground plane in what is commonly known as a "microstrip" configuration. The circulator assembly 100 includes a first substrate 105 that is made from a non-ferrous dielectric material and is used to support a circuit trace 110. Typically, the first substrate 105 is made from dielectric materials that are used in constructing conventional printed circuit boards (PCBs). For example, the first substrate 105 may be made from polymers, such as but not limited to polytetrafluoroethylene (PTFE), combinations of PTFE and woven glass fibers, PTFE and random micro fiber glass, PTFE and ceramic, polyamides and polyamide compositions including polyamide and glass, polyamide film, epoxy resins, such as cyanate ester, bisamalemide tiazine, and the like. However, the first substrate 105 may also be made from semiconductor material such as but not limited to silicon (Si), gallium arsenide (GaAs), indium antimonide (InSb), cadmium sulfide (CdS), and cadmium selenide (CdSe) for specialized applications.

Figure 1B:
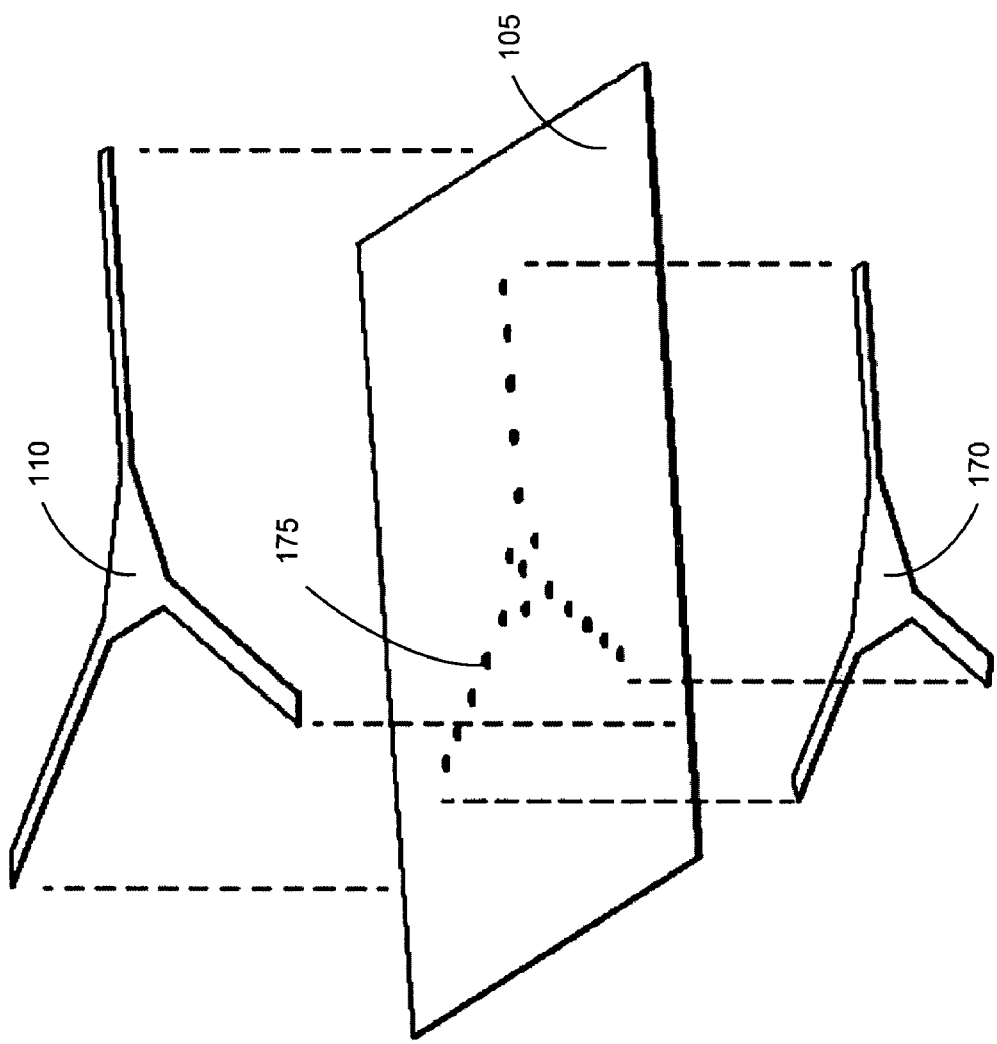
FIG. 1B is an illustration of an exploded view of a circuit trace for a circulator assembly in accordance with some embodiments of the present invention.

The circuit trace 110 is applied to one side of the substrate 105 using standard PCB manufacturing techniques, such as physical vapor deposition (PVD), also known as "sputtering," chemical vapor deposition (CVD), and the like. The circuit trace 110 is a conductive material, such as gold (Au), silver (Ag), copper (Cu), aluminum (Al), titanium (Ti) and the like is first applied to the substrate 105. A mask that contains the pattern of the circuit element, in this case a circulator component 115 is placed on the conductive material. The exposed conductive material is removed from the substrate. The mask is then removed leaving desired circuit trace 110. The circuit trace 110 of the circulator 100 created in this manner, forms a continuous trace with no discontinuities or irregularities. Alternatively, the circulator circuit trace 110 may be located on side of the substrate 105 and connected through conductive vias 175 passing through the substrate 105 to a second circulator circuit trace 170 as shown in FIG. 1B. The use of the second circulator circuit trace 170 is increase performance by increasing bandwidth, lowering insertion loss, and improving isolation.

The circulator circuit trace 110 may have the form of any conventional circulator. In FIG. 1, the circulator circuit trace 110 contains a RF resonator and three conductive transfer strips that extend from the points of the triangular resonator and terminate at electrodes or contact pads (not shown) for connecting to an external circuit. Although the circuit trace 110 is depicted as having a triangular-shaped RF resonator, those skilled in the art will appreciate that the circuit trace 110 may take on any shape that contains a central resonator and three equally spaced conductive transfer strips extending from the central RF resonator without departing from the scope of the invention.

The circulator assembly 100 also has a second substrate 120 disposed below the first substrate 105. The second substrate 120 is also made from a dielectric material and is preferably made from a dielectric material used for constructing PCBs, as described above. The second substrate 120 may be made from the same dielectric material as the first substrate 105 or made from a different dielectric material based on the design criteria. The second substrate 120 includes an aperture 125 that is proximately aligned with the circulator circuit trace 110. The aperture 125 is typically circular in shape; however, the aperture can also be any polygonal shape, such as a square, a triangle, a pentagon, a hexagon, and so forth. The bottom side of the second substrate 120 includes a cladding 130 that forms a continuous ground plane. The cladding 130 is a thin layer of a conductive material such as copper, gold, silver, aluminum, titanium, and the like.

The circulator assembly 100 also contains a ferrite element 135 disposed within the aperture 125 of the second substrate 120. The ferrite element 135 is circular in shape and has diameter that matches the diameter of the aperture 125 so that it may rigidly affixed into the aperture 125. Although the ferrite element 135 is typically described as being circular, the ferrite element 135 will have the same shape as the aperture 125 to insure that the ferrite element 135 self aligns itself with the circulator circuit trace 110 and minimize any discontinuities between the second substrate 120 and the ferrite element 135.

Disposed beneath the ferrite element 135 is a conductive material 140. The conductive material 140 is slightly larger than the aperture 125 to ensure that it makes electrical contact with the cladding 130, thereby providing a continuous ground plane across the circulator circuit trace 110. The conductive material 140 is typically very thin, approximately in the range from 0.001 inches to 0.003 inches. As a result, the conductive material 140 approximately coplanar with the cladding 130, which provide improved shielding and improved electrical performance over conventional circulators. In one exemplary embodiment, the conductive material 140 is a conductive thin film adhesive that can be cut into any desired shape. The conductive thin film adhesive 140 is simply adhered to the cladding 130 of the second substrate 120 making sure that it fully covers the aperture 125, thereby ensuring a continuous ground plane. In addition to completing the ground plane, the conductive tape also provides additional support to the ferrite element 135, thereby further securing it within the aperture 125 and eliminating the outer support casing required for conventional circulators. In another exemplary embodiment, the conductive material 140 may be a conductive adhesive, such as conductive two-part epoxy. The conductive two-part epoxy is applied across the aperture in a thin layer while in the molten state, typically having a thickness approximately between 0.001 inches and 0.003 inches and allowed to cure. In yet another exemplary embodiment, the conductive material 140 may simply be a thin metal film. The metal film can be secured to the cladding using a thin bead of adhesive.

The circulator assembly 100 also contains a magnet 145 located below the conductive material 140 and proximately aligned with both the ferrite material 135 and the circulator circuit trace 110. In an exemplary embodiment, the magnet 145 is a permanent magnet and is polarized to produce a direct current (DC) biased magnetic field that passes through the ferrite material 135 and the circulator circuit trace 110. The magnet 145 is held in place by the conductive material 140.

The circulator assembly 100 may also contain a yoke 155 that is disposed beneath the magnet 145. The yoke 155 is typically slightly larger than the magnet 145 and has a plate 160 and a tang 165 that extends around the periphery of the plate 160. The tang 165 has a height sufficient to cover the magnet 145 to provide both a DC magnetic field return path and adequate shielding from external magnetic fields.

The circulator assembly 100 also contains three connection pads (not shown) at the ends of each of the three conductive strips of the circulator circuit trace 110 that electrically connect the circuit assembly 100 to an external circuit. The connection pads may be mouse holes, which are known in the art. Alternatively, the connection pads may be formed on the underside of the second substrate 120 for use as a surface mounted component.

Figure 2:
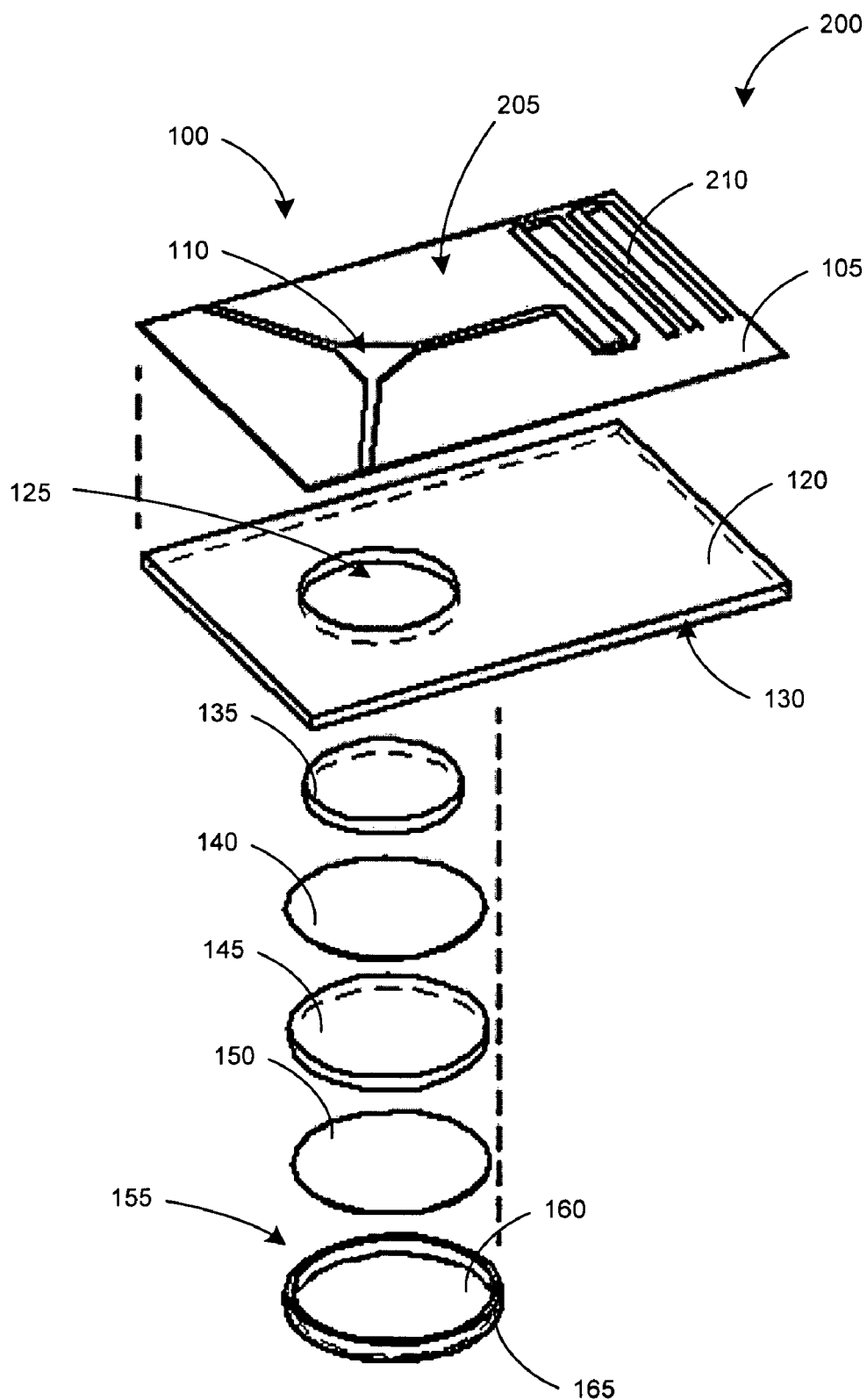
FIG. 2 is an illustration of an exploded view of a circulator assembly integrated with a microstrip circuit assembly in accordance with the present invention.

FIG. 2 is an illustration of an exploded view of a microstrip circuit 200 containing the circulator assembly 100. As shown by the figure, the circulator assembly 100 is fully integrated into the microstrip circuit 200 as opposed to being connected through manual interconnections as required by conventional circulators. The microstrip circuit 200 contains a continuous circuit trace 205 deposited or etched on a first substrate 105. The continuous circuit trace 205 contains at least one circulator circuit trace 110 electrically connected to at least one other RF component 210. The RF component 210 may be a filter component, a coupler component, or any other type of RF component. The RF component 210 may even be another circulator. Because the circulator circuit trace 110 is integrated within the continuous circuit trace 205 that contains the RF component 210, there are no discontinuities or manual interconnects between the circulator circuit trace 110 and the RF component 210. Integration of the circulator assembly 100 provides several advantages over conventional circulator designs. First, because conventional circulator designs require interconnects between the circulator and an external circuit element, there will always be an impedance mismatch at the interconnect, which results in unwanted signal degradation through the system. However, since the circulator circuit trace 110 is integrated within the circuit trace 205, there is no impedance mismatch between the circulator circuit trace 110 and the electronic component 210. Therefore, there is little to no signal degradation at the interfaces between the circulator assembly 100 and other connecting RF components 210. Second, because interconnects bridge a discontinuity in a circuit trace, conventional circulators tend to have high insertion losses at the interconnects. Since the present invention eliminates any interconnects, insertion losses associated with those interconnects are eliminated. Additionally, by eliminating the interconnects, there are no discontinuities when connecting the circulator assembly 100 into the microstrip circuit 200 to allow RF interference to enter the microstrip circuit 200. As a result, interference due to unwanted RF signals in the circulator assembly 100 is greatly reduced.

A second substrate 120, which contains a cladding 130 on the outside surface, is disposed below the first substrate 105. The second substrate 120 contains an aperture 125 that is aligned with the circulator circuit trace 110 of the continuous circuit trace 205. Typically, the first substrate 105 is much thinner than the second substrate. The first substrate 105 has a thickness in the range of approximately 0.001 inches to 0.010 inches, while the second substrate 120 has a thickness in the range of approximately 0.010 inches to 0.070 inches. In one exemplary embodiment the first substrate 105 has a thickness in the range of approximately 0.003 inches to 0.007 inches, and more preferably 0.005 inches, while the second substrate 120 has a thickness in the range of approximately 0.01 inches to 0.07 inches, and more preferably 0.03 inches. Those skilled in the art will appreciate that the thicknesses of the first substrate 105 and the second substrate 120 are necessarily not limited to the values herein provided and may be adjusted to any thickness as required by a particular design.

A ferrite element 135 is located within the aperture 125. Beneath the ferrite element 135 is a conductive material 140. In an exemplary embodiment, the conductive material 140 is made from a conductive thin film adhesive, which is laid across the ferrite element 135. The conductive material 140 is slightly larger than the aperture 125. This allows the conductive material 140 to make electrical contact with the cladding 130 and form a continuous ground plane over the entire continuous circuit trace 205. Maintaining the ground plane that is continuous over the entire continuous circuit trace 205 provides improved shielding of the microstrip circuit 200 from unwanted external RF signals. Furthermore, since the conductive material 140 is made from a thin film, typically on the order of approximately 0.001 inches, the conductive material 140 is substantially planar with the cladding 130, which improves electrical performance of the microstrip circuit 200, since path length along the ground plane is substantially the same as the path length along the continuous circuit trace 205.

A magnet 145 is disposed below the conductive material 140 and is proximally aligned with the ferrite element 135. The magnet 145 is used to induce a biased magnetic field through the ferrite element 135. A yoke 155 may then be bonded to the magnet 145 using an adhesive material 150 to provide a return path for the biased magnetic field and also shield the circulator assembly 100 from unwanted external magnetic fields.

Figure 3:
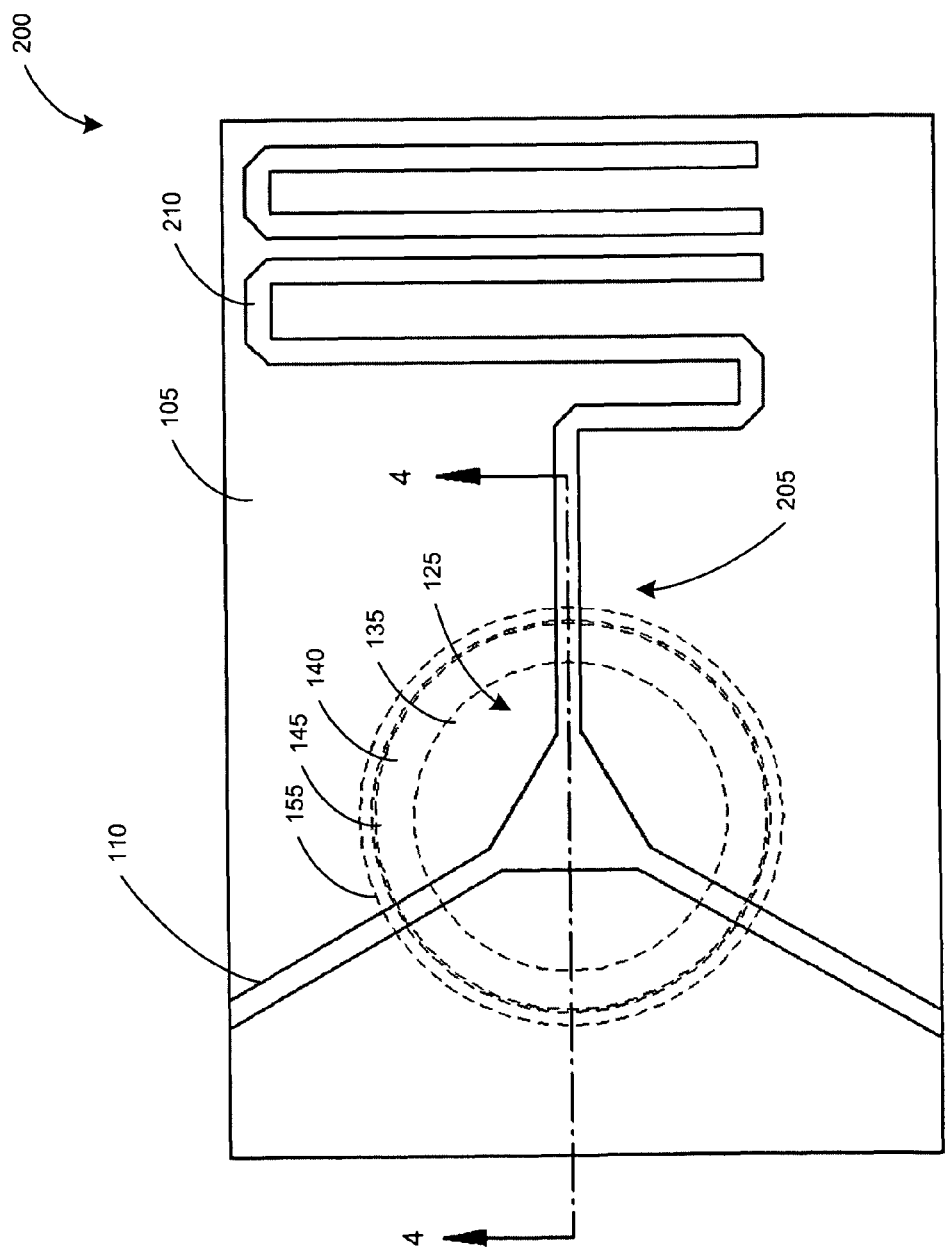
FIG. 3 is an illustration of an overhead view of a circulator assembly integrated with the microstrip circuit assembly in FIG. 2 in accordance with some embodiments of the present invention.

FIG. 3 is a top-down view of the microstrip circuit 200 containing the integrated circulator assembly 100 of FIG. 2, in accordance with some embodiments of the present invention. The continuous circuit trace 205 containing the circulator circuit trace 110 and another RF component 210 is shown by the figure. Disposed beneath the first substrate 105 is the second substrate 120 (not shown), which contains the ferrite material 135 located within the aperture 125. As seen from the figure, the ferrite material 135 is proximately aligned with the central RF resonator of the circulator circuit trace 110. The conductive material 140 extends beyond the aperture 125 to provide an electrical contact with the cladding 130 (not shown) on the backside of the second substrate 120 (not shown). The conductive material 140 is also proximately aligned with the aperture 125.

Figure 4:
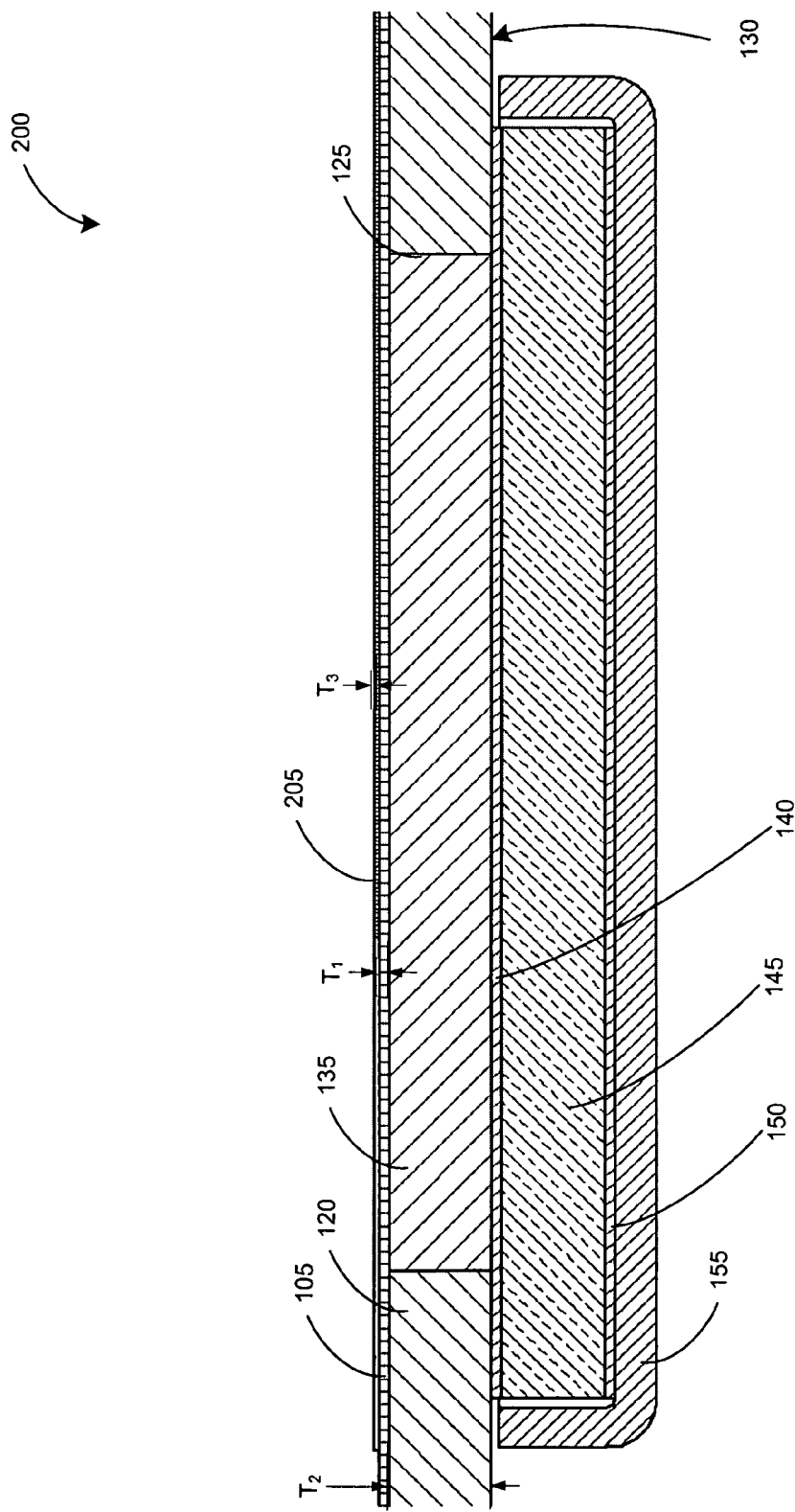
FIG. 4 is an illustration of a cross-sectional view of the circulator assembly taken along the 4-4 line of FIG. 3 in accordance with some embodiments of the present invention.

FIG. 4 is a cross-sectional view of a portion of the microstrip circuit 200 taken along the 4-4 line of FIG. 3. The continuous circuit trace 205, which contains the circulator circuit trace 110, is located on the top surface of the first substrate 105. The first substrate 105 is composed of a thin layer of a nonferrous dielectric material, such as PTFE, or other materials used for the manufacture of PCBs. The first substrate 105 is relative thin and has a thickness, $T_1$ that in the range of approximately 0.001 inches to 0.010 inches, while the second substrate 120 has a thickness $T_2$, in the range of approximately 0.010 inches to 0.070 inches. In one exemplary embodiment the first substrate 105 has a thickness $T_1$, in the range of approximately 0.003 inches to 0.007 inches, and more preferably 0.005 inches, while the second substrate 120 has a thickness $T_2$, in the range of approximately 0.01 inches to 0.07 inches, and more preferably 0.03 inches. Those skilled in the art will appreciate that the thicknesses $T_1$ and $T_2$ of the first substrate 105 and the second substrate 120 respectively, are necessarily not limited to the values herein provided and may be adjusted to any thickness as required by a particular design. The continuous circuit trace 205 is typically deposited on top of the first substrate 105 in a very thin layer, having a thickness, $T_3$, in the range of approximately 0.0008 inches to 0.0015 inches.

The second substrate 120 is bonded to the bottom of the first substrate 105 using standard circuit board adhesives known in the art. The second substrate 120 is also made from non-ferrous dielectric materials, which are used for the construction of PCBs, such as PTFE and the like. In one exemplary embodiment, the second substrate 120 and the first substrate 105 are made from the same dielectric material. However, those skilled in the art will appreciate that the first substrate 105 and the second substrate 120 may be made from different non-ferrous dielectric materials with different dielectric constants, as required by a particular application. The bottom of the second substrate 120 also contains a thin cladding 130 that provides the ground plane for the microstrip circuit 200.

Integrated within the second substrate 120 is the ferrite material 135. The ferrite material 135 is disposed in the aperture 125, which has been milled into the second substrate 120. Alternatively, the ferrite material 135 may be affixed in the aperture 125 using a conventional heat resistant, non-conductive adhesive material, such as a two-part epoxy, which is known in the art. The ferrite material 135 has substantially the same thickness, $T_2$, as the second substrate 120 so the top of the ferrite material 135 and the top of the second substrate 120, and the bottom of the ferrite material 135 and the bottom of the second substrate 120, form substantially coplanar surfaces. This allows the first substrate 105 to lay flat upon the second substrate 120 without any significant variation in height at the interface between the second substrate 120 and the ferrite material 135, as any variation may stress the first substrate 105. Stresses in the first substrate 105 may lead to cracking or even rupture of the first substrate 105 above the interface between the second substrate 120 and the ferrite material 135, which can lead to degradation in the performance or even complete failure of the stripline circuit 200. The desirability to have the bottom of the ferrite material 135 and the bottom of the second substrate 120 being substantially coplanar is to provide planar ground plane, which has previously been discusses.

The conductive material 140 is disposed on the underside of the second substrate 120. The conductive material 140 extends beyond the boundary of the aperture 125 so that it provides sufficient electrical contact with the cladding 130 on the underside of the second substrate 120, thereby providing a continuous ground plane for the microstrip circuit 200. In addition to providing a continuous ground plane across the ferrite element 135, the conductive material 140 also bonds the ferrite element 135 in the aperture 125 of the second substrate 120. In addition, the conductive material 140 has sufficient flexibility to accommodate small variances in the thickness between the second substrate 120 and the ferrite element 135 due manufacturing tolerances. The magnet 145 is larger than the aperture 125 and is also aligned with the ferrite element 135 to ensure that the ferrite element 135 is completely covered. Finally, the yoke 155 is bonded to the magnet 145 using an adhesive material 150. The tang 165 (FIG. 2) of the yoke 155 extends in an upward direction from the plate 160 (FIG. 2) and fully surrounds the magnet 145 thereby shielding the magnet 145 from external magnetic fields that may interfere with the operation of the circulator assembly 100.

Figure 5:
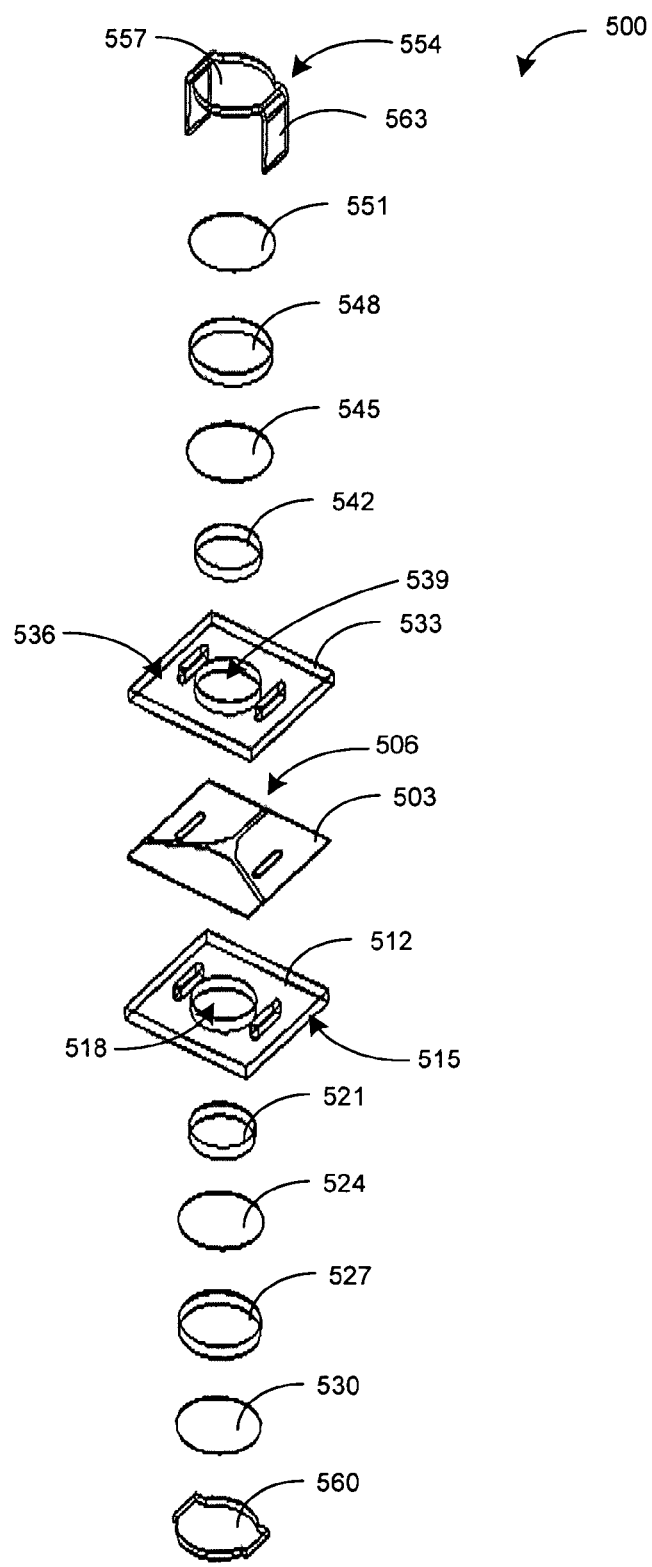
FIG. 5 is an illustration of an exploded view of an exemplary embodiment of a circulator assembly for use with a stripline circuit in accordance with the invention.
Figure 6:
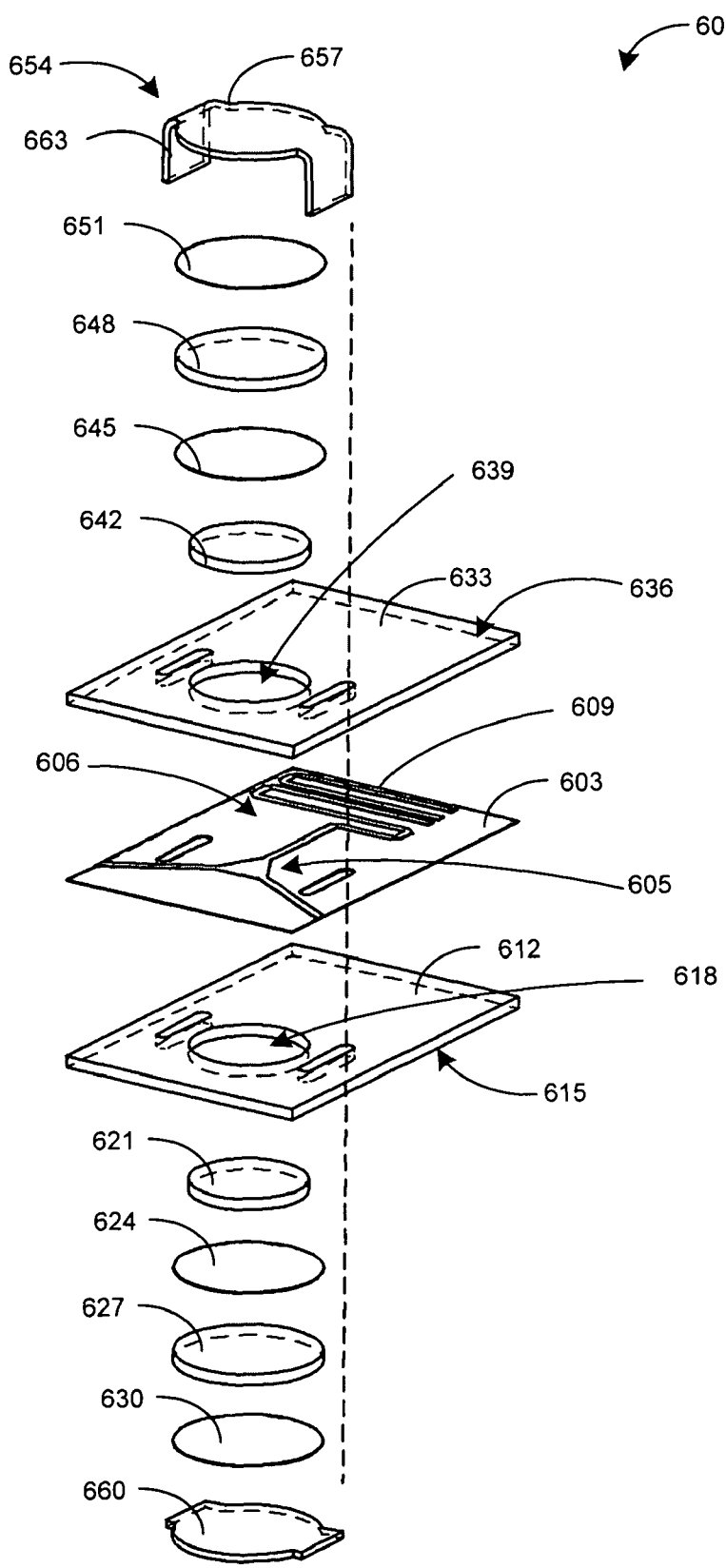
FIG. 6 is an illustration of an exploded view of a circulator assembly integrated within a stripline circuit assembly in accordance with some embodiments of the present invention.

FIG. 5 is an exploded view of an exemplary embodiment of a circulator assembly 500 arranged in a stripline configuration in accordance with some embodiments of the present invention. The circulator assembly 500 includes a first substrate 503 that supports a circulator circuit trace 506. The first substrate 503 is composed of a thin layer of nonferrous dielectric material, such as PTFE, and other materials used for the manufacture of PCBs. The circulator circuit trace 506 contains a triangular-shaped central resonator and three conductive transfer strips spaced equally around the perimeter of the triangular-shaped central resonator. Those skilled in the art will appreciate that other shapes may be used for the central resonator, without departing from the scope of the invention.

The circulator assembly 500 also contains a second substrate 512 that is positioned below the first substrate 503 and a third substrate 533 that is positioned above the first substrate 503, thereby forming a laminar structure. The second substrate 512 and the third substrate 533 are also made from a non-ferrous dielectric material. In an exemplary embodiment, the second substrate 512 and the third substrate 533 are made from the same dielectric material used for the first substrate 503. In another exemplary embodiment, the second substrate 512 and the third substrate 533 are made from a dielectric material that is different from the dielectric material used for the first substrate 503.

The second substrate 512 contains a first cladding 515 disposed on the bottom exterior surface (not shown). Similarly, the third substrate 533 contains a second cladding 536 deposited on the top exterior surface. The first and second claddings 515 and 536 are formed by depositing a thin layer of metal using standard deposition techniques, such as PVD, CVD, and the like. The second substrate 512 and the third substrate 533 each contain an aperture 518 and 539, respectively. The apertures 518 and 539 are aligned with the circulator circuit trace 506 on the first substrate 503. A first ferrite element 521 is inserted into the first aperture 518 and a second ferrite element 542 is inserted into the second aperture 539. The ferrite elements 521 and 542 are typically placed into the apertures 518 and 539, respectively. However, the ferrite elements 521 and 542 may be affixed in the apertures 518 and 539 using an adhesive, such as a two-part epoxy and the like.

A first conductive material 524 is disposed across the underside of the first ferrite element 521. Similarly, a second conductive material 545 is placed across the top of the second ferrite element 542. In an exemplary embodiment, the conductive materials 524 and 545 are formed from conductive thin film adhesive, which are slightly larger than the apertures 518 and 539. The conductive thin film adhesives make electrical contact with the claddings 515 and 536 to provide two continuous ground planes, which shield the circulator circuit trace 506 from unwanted RF radiation. Alternatively, rather than using a conductive thin film adhesive, the conductive materials 524 and 545 may be made from a conductive adhesive, such as a conductive two-part epoxy. Typically, the conductive materials 524 and 545 are relatively thin. As a result, the conductive materials 521 and 548 are approximately coplanar with the claddings 515 and 536.

The circulator assembly 500 also contains a first magnet 527 disposed below the first ferrite element 521. Similarly, a second magnet 548 is located above the second ferrite element 542. Both the first magnet 527 and the second magnet 548 are proximately aligned with the circulator circuit trace 506 to produce a DC biased magnetic field that passes through the ferrite elements 521 and 542 and the circulator circuit trace 506.

The circulator assembly 500 may also have a yoke 554 that has a top plate 557 and a bottom plate 560. The top plate 557 of the yoke 554 is placed on top of the second magnet 548. A first adhesive material 551 may be inserted between the top plate 557 and the second magnet 548 to affix the top plate 557 to the second magnet 548. Similarly, the bottom plate 560 is disposed on the bottom of the first magnet 527 and may be bonded to the first magnet 527 by a second adhesive material 530. In an exemplary embodiment, the first adhesive material 551 and the second adhesive material 530 are made from the same conductive material that is used to complete the ground planes across the second substrate 509 and the third substrate 536.

The yoke 554 may also contain at least one tang 563 that extends between the top plate 557 and the bottom plate 560 and provides a return path for the magnetic field induced by the magnets 527 and 548. In an exemplary embodiment, the yoke 554 includes two tangs 563, which pass through a first pair of cutouts in the first substrate 503, a second pair of cutouts in the second substrate 512, and a third pair of cutouts in the third substrate 533 and connects to the bottom plate 560. The top plate 557 and the bottom plate 560 of the yoke 554 are approximately the same size or slightly larger than the magnets 527 and 548 to provide sufficient shielding to the circulator circuit trace 506. Although the yoke 554 has been described as having two tangs 563, those skilled in the art will appreciate that the yoke 554 may have either a single tang 563 or three tangs 563 located intermediate of the three conductive strips of the circulator circuit trace 506. Each of the first pair of cutout, the second pair of cutouts, and the third pair of cutout are edge plated to provide additional shielding and isolation for the circulator assembly 500.

The circulator assembly 500 also contains three connection pads (not shown) at the ends of each of the three conductive strips of the circulator circuit trace 506 that electrically connect the circulator assembly 500 to an external circuit. The connection pads may be mouse holes, which are known in the art. Alternatively, the connection pads may be formed on the underside of the second substrate 512 for use as a surface mounted device. The connection pads may be formed on the underside of the second substrate 512 by etching vias through the second substrate 512 up to each of the three conductive strips. The vias are then filled with a conductive material such as copper, gold, silver, aluminum, and the like.

A stripline circuit 600 in accordance with some embodiments of the present invention is shown in FIGS. 6-9. The stripline circuit 600 includes at least one circulator assembly 500 (FIG. 5) that is integrated into the stripline circuit 600. The circulator assembly 500 is integrated with at least one RF component 609 in a continuous circuit trace 606 etched on a first substrate 603 in accordance with some embodiments of the present invention. The RF component 609 may be a filter component, a coupler component, or any other type of electronic component. Because the circulator circuit trace 605 is integrated with the continuous circuit trace 606, there are no discontinuities or interconnects between the circulator circuit trace 506 and the RF component 609. As with the microstrip circuit 200, this configuration provides several advantages over conventional circulator designs, including improved impedance matching between the circulator assembly 500 and the other electronic components 609, low insertion losses, improved shielding to unwanted RF signals, and greater reliability. Although the stripline circuit 600 is shown with a single circulator assembly 500 integrated with a single RF component 609, those skilled in the art will appreciate that the stripline circuit 600 may be expanded to include any number of circulator assemblies 500 integrated with any number of RF components 609 without departing from the scope of the invention.

A second substrate 612 and the third substrate 633 are disposed below and above the first substrate 603, respectively and have claddings 615 and 636 deposited on their respective outside surfaces. The second substrate 612 and third substrate 633 contain apertures 618 and 639 respectively, that are proximately aligned with the circulator circuit trace 605. Ferrite elements 621 and 642 are disposed within the apertures 618 and 639. Conductive material 624 and 645 overlap the apertures 618 and 639. In an exemplary embodiment, the conductive materials 624 and 645 are made from a conductive thin film adhesive, which is laid across the ferrite elements 621 and 642. Because the conductive thin film adhesive 624 and 645 are larger than the apertures 618 and 639, the thin film adhesive makes electrical contact with the claddings 615 and 636 and forms continuous ground planes over the entire continuous circuit trace 606. Maintaining ground planes that are continuous over the entire continuous circuit trace 606 provides improved shielding of the stripline circuit 600 from unwanted external RF signals. Furthermore, since the conductive materials 624 and 645 are made from a conductive thin film adhesive, which has a thickness typically on the order of approximately 0.001 inches, the conductive film is substantially planar with the claddings 615 and 636, which further improves the electrical capabilities since the path length along the ground planes are substantially the same length as the path length of the continuous circuit trace 606. Magnets 627 and 648 are disposed below and above the conductive material 624 and 645 and are proximally aligned with the ferrite elements 621 and 642. The yoke 654 may then be bonded to the magnets 627 and 648 using an adhesive material 630 and 651 to provide a return path for the DC biased magnetic field and also to provide shielding to the circulator assembly 500 (FIG. 5) from unwanted external magnetic fields.

Figure 7:
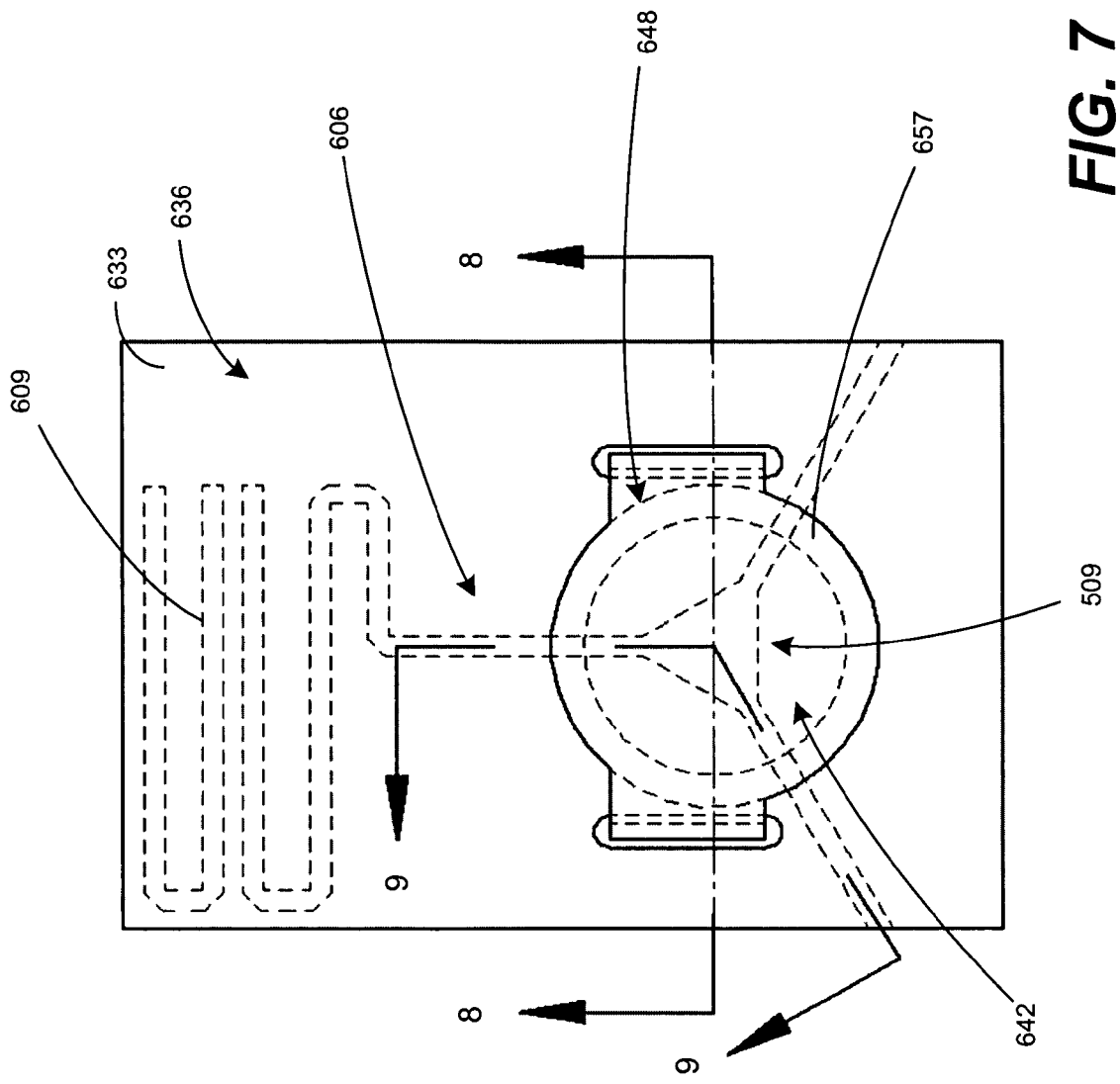
FIG. 7 is an illustration of an overhead view of a circulator assembly integrated within a stripline circuit assembly in accordance with some embodiments of the present invention FIG. 8A and FIG. 8B, collectively known as FIG. 8, are illustrations of a cross-sectional view of the circulator assembly taken along the 8-8 line of FIG. 7 in accordance with some embodiments of the present invention.

FIG. 7 is an overhead view of the stripline circuit 600 in accordance with some embodiments of the present invention. The first substrate 603 (not shown), which carries the continuous circuit trace 606 that shown in broken lines, is disposed between a second substrate 612 (not shown) and a third substrate 636. The continuous circuit trace 606 includes the circulator circuit trace 605 electrically connected to the RF component 609. Since the circulator circuit trace 605 and the RF component 609 are integrated into the same continuous circuit trace 606, there are no interconnects between the circulator circuit trace 605 and the RF component 609. This allows the stripline circuit 600 to have better electrical properties, such as improved impedance matching between the circuit components, improved signal transmission, and improved heat distribution through the continuous circuit trace 606.

In addition, the cladding 636 cover the entire exterior, or top surface of the third substrate 633. The conductive material 645 extends beyond the aperture 639 to provide an electrical contact with the cladding 636 to form a continuous ground plane over the entire continuous circuit trace 606. This allows the circulator circuit trace 605 to share a common ground with the RF component 609. Having a common ground between the circulator circuit trace 605 and the RF component 609 provides several advantages over conventional circulators. The common ground plane provides increased shielding of the continuous circuit trace 606 from external RF radiation. The common ground plane also increases line isolation and reduces radiative emissions from the stripline circuit 600 to improve the electrical performance of the stripline circuit 600.

Figure 8A:
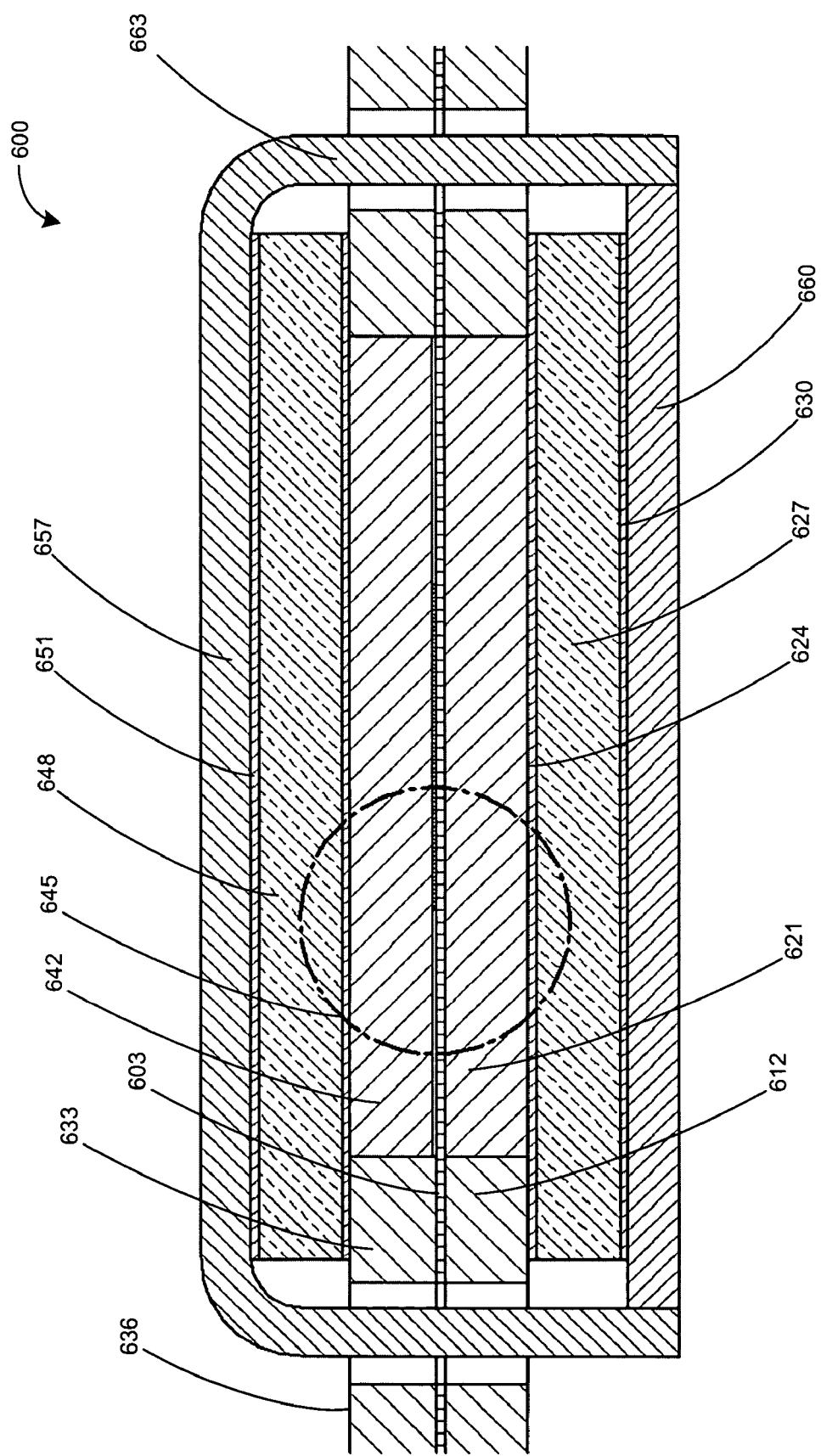
Figure 8B:
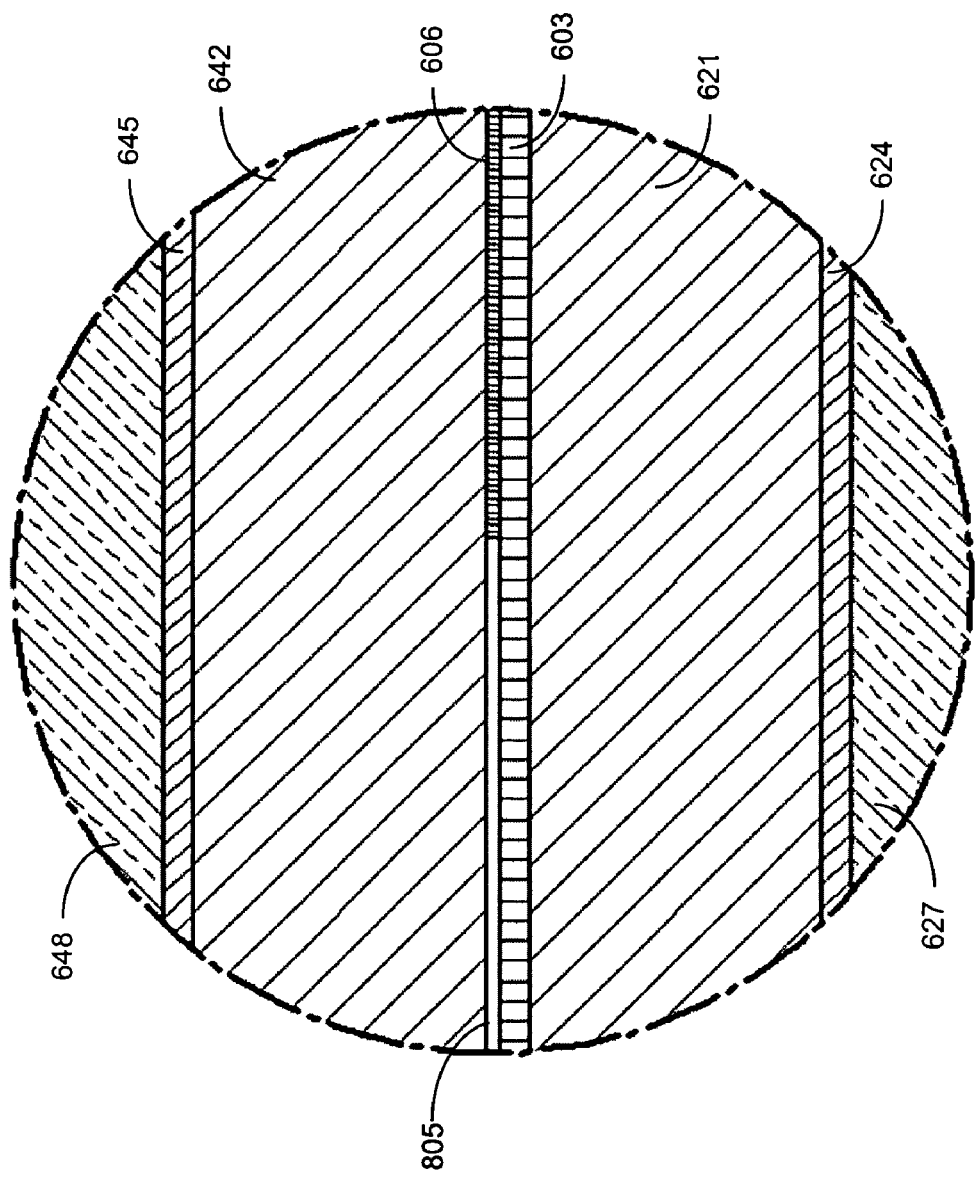
Figure 9:
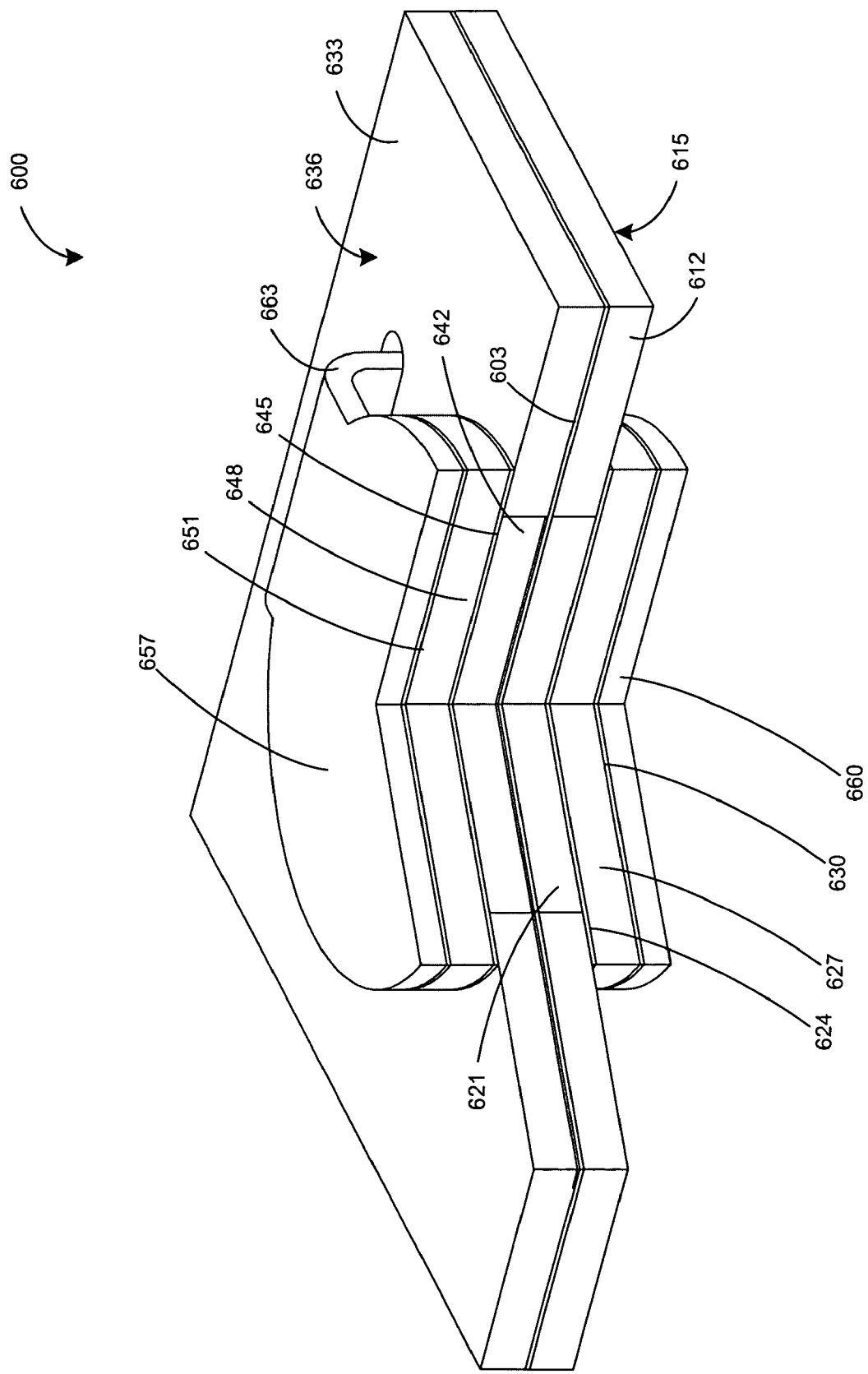
FIG. 9 is an illustration of an isometric view of the circulator assembly taken along the 9-9 line of FIG. 7 in accordance with some embodiments of the present invention.

Referring to FIGS. 8A, 8B and FIG. 9, a cross-sectional view of a portion the stripline circuit 600 is shown. In particular, FIG. 8A is an illustration of a cross-section of the circuit assembly 600 taken along the 8-8 line of FIG. 7, while FIG. 8B is a magnified view of the cross-section shown in FIG. 8A. FIG. 9 is an illustration of an isometric view of the stripline circuit 600 taken along the 9-9 line of FIG. 7. The cross sectional views illustrate the relative thickness of the first substrate 603 to the second and third substrates 612 and 633. The first substrate 603 has a thickness, $T_1$ that is in the range of approximately 0.001 inches to 0.010 inches. The second and third substrates 612 and 633 typically have the same thickness, $T_2$ that is greater than the thickness of the first substrate 603 and in the range of approximately 0.01 inches to 0.07 inches. In a preferred embodiment, the first substrate 603 has a thickness $T_1$, in the range of approximately 0.003 inches to 0.007 inches and more preferably about 0.005 inches, while the second substrate has a thickness $T_2$, in the range of approximately 0.01 inches to 0.07 inches, and more preferably about 0.03 inches. The detail of a portion of the continuous circuit trace 606 is shown in FIG. 8B to show its relative thickness. Typically, the continuous circuit trace 606 is very thin and has a thickness $T_3$, usually in the range of approximately 0.25 ounces/meter$^2$ (oz/m$^2$) to 1.0 (oz/m$^2$). Any gaps 805 (FIG. 8B) between the first substrate 603 and the third substrate 633 are filled with a standard thermally stable adhesive, which is well known in the manufacturing of PCBs. The continuous circuit trace 606 is substantially uniform along its entire path due to the elimination of interconnects between the circulator assembly 500 and the RF component 609. The uniformity of the circuit trace 606 leads to the improved heat distribution along the continuous circuit trace 606, which allows the stripline circuit 600 to handle higher power signals.

Figure 10:
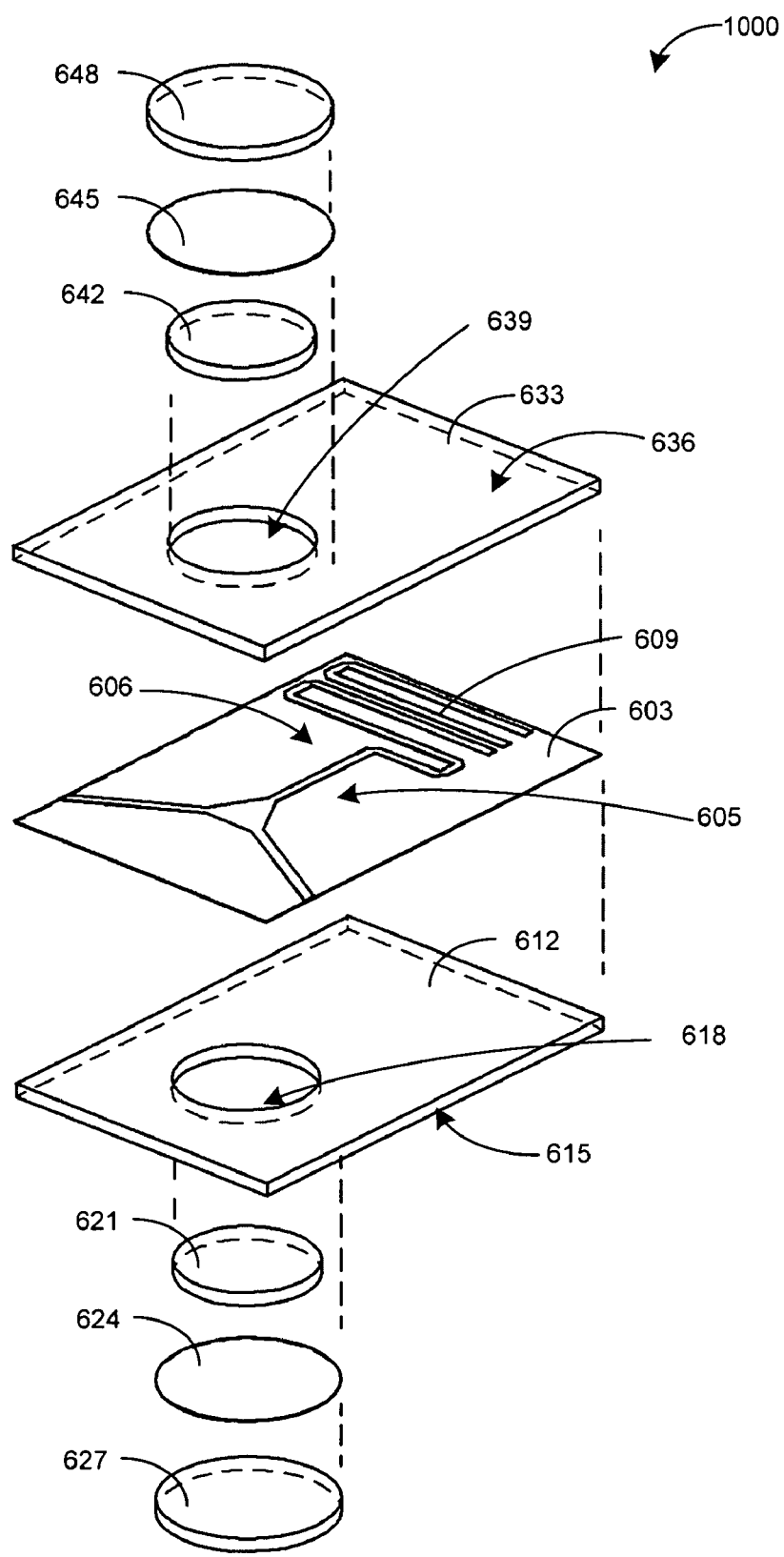
FIG. 10 is an illustration of an exploded view of another embodiment of a circulator assembly integrated with in a stripline circuit assembly in accordance with the present invention.

FIG. 10 is an illustration of another exemplary embodiment of a stripline circuit assembly 1000 containing a circulator assembly integrated with at least on other RF component in accordance with some embodiments of the present invention. The stripline circuit 1000 is identical to the stripline circuit 600 shown in FIG. 6, except the yoke 654 has been eliminated from the circulator assembly 500.

Figure 11:
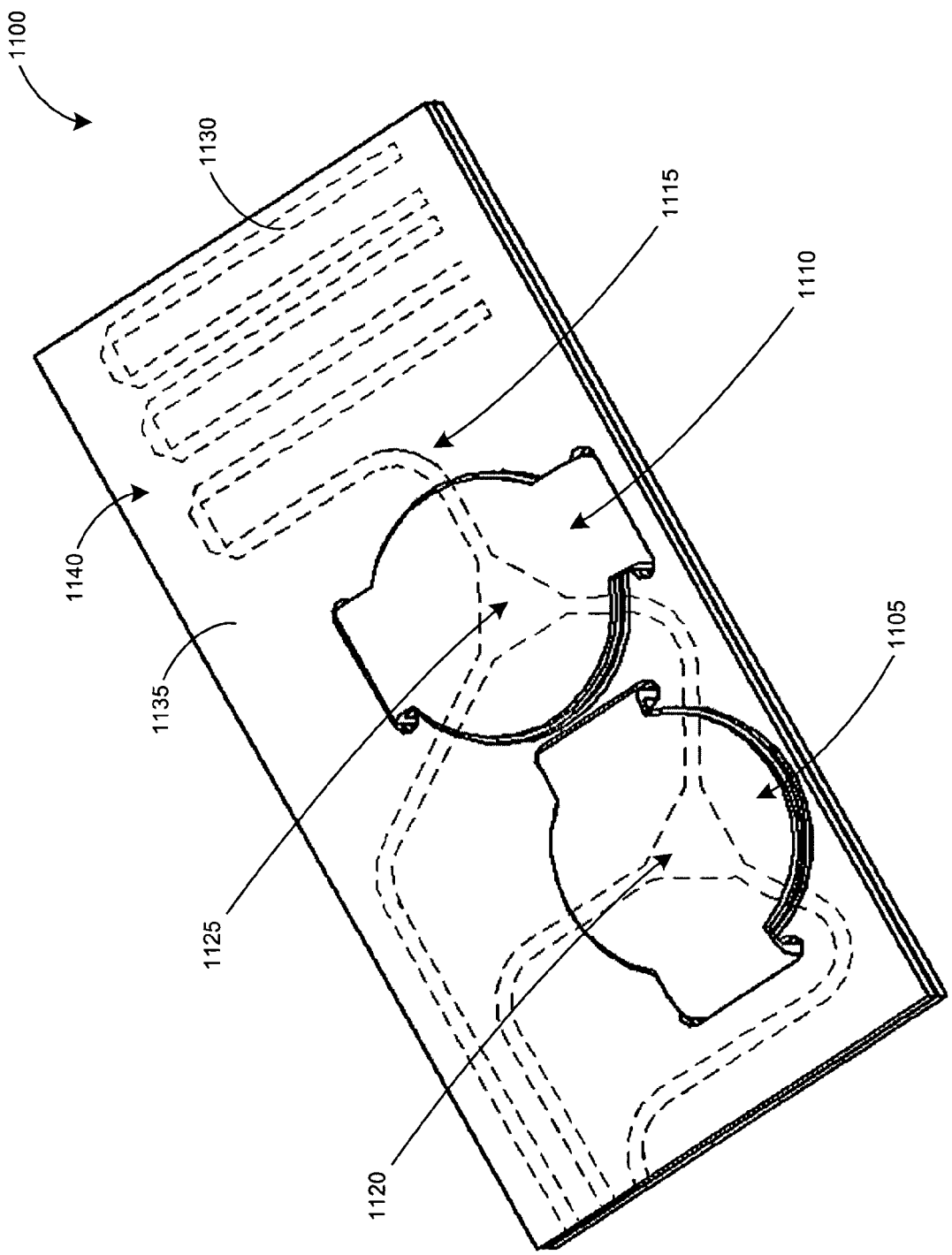
FIG. 11 is an illustration of an overhead view of a stripline circuit assembly containing two integrated circulator assemblies in accordance with some embodiments of the present invention.

Although the stripline circuit has been shown to have a single circulator element integrated into the circuit trace 606, those skilled in the art will appreciate that the stripline circuit assembly 600 can contain any number of circulator assemblies integrated within the circuit trace. FIG. 11 in an illustration of another exemplary stripline circuit 1100 that contains two circulator assemblies 1110 and 1115 that have a circulator circuit trace 1120 and 1125, respectively connected in series, which are integrated within a continuous circuit trace 1115 containing at least one other electronic element 1030 in accordance with the present invention. As seen by the figure, the circulator circuit traces 1120 and 1125 are connected through a common circuit trace 1115 to the RF component 1130 without using interconnects. Furthermore, the circulator assemblies 1105 and 1110 share a common ground plane with the RF component 1130, where the common ground plane 1130 extending over the entire continuous circuit trace 1115.

Figure 12:
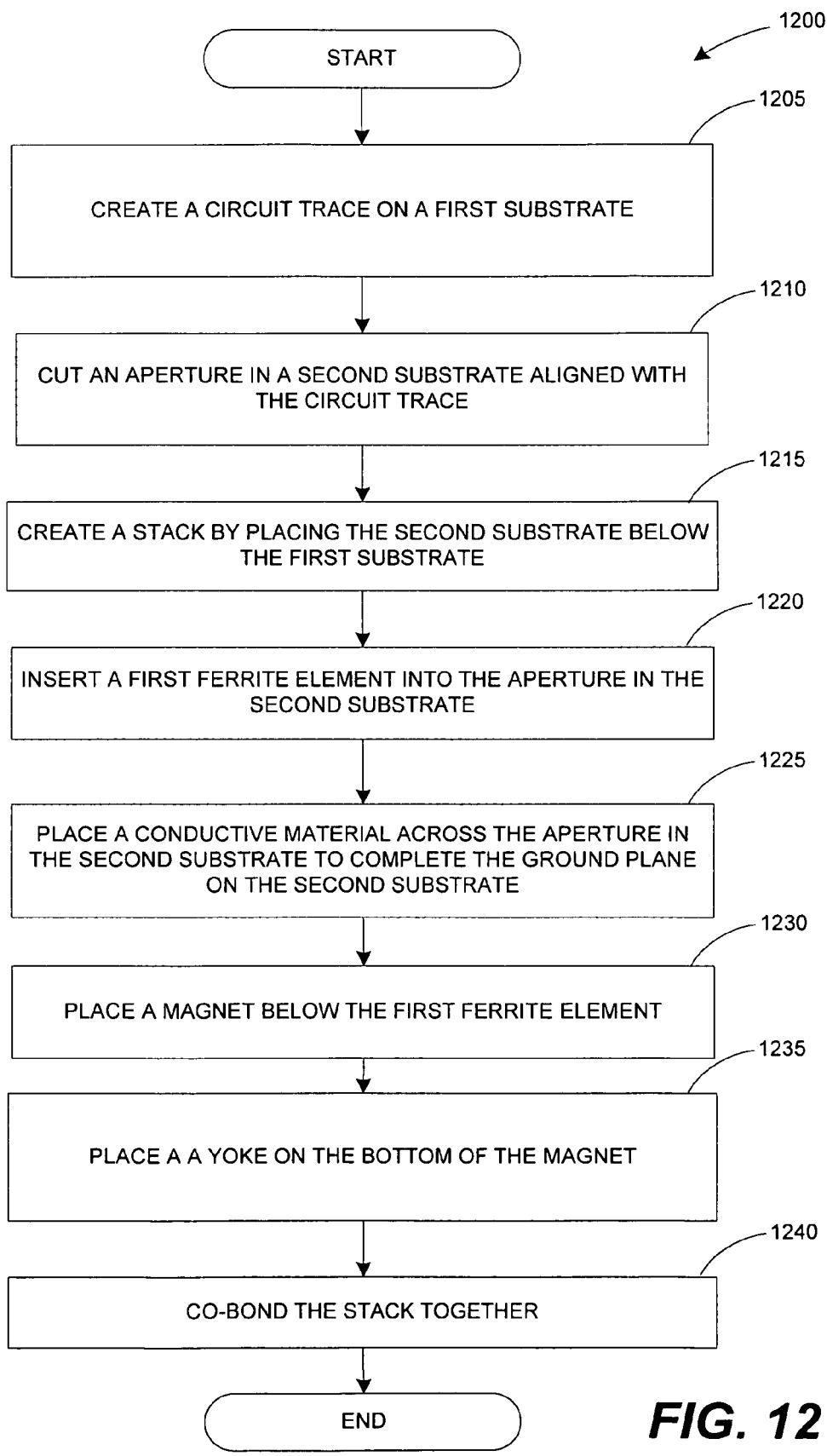
FIG. 12 is a logic flow diagram illustrating a method for manufacturing a circulator assembly in accordance with some embodiments of the present invention.

FIG. 12 is a flow diagram illustrating a process 1200 for manufacturing the circulator assembly 100 in accordance with some embodiment of the present invention. The process 1200 allows the large scale manufacturing of highly reliable and inexpensive circulator assemblies 100 by using readily available low cost materials and eliminating the need for manually assembling the microstrip circulator assemblies 100. Although the process 1200 is described for manufacturing a microstrip circulator assembly 100, those skilled in the art will appreciate that the process 1200 is also applicable for manufacturing a stripline circulator 500 (FIG. 5) in accordance the present invention. Furthermore, those skilled in the art will appreciate that the method 1200 is equally applicable for manufacturing the microstrip circuits 200 (FIG. 2) and stripline circuits 600 (FIG. 6) that include integrated circulator assemblies.

Process 1200 begins at 1205, in which a circuit trace 110 is created on a first substrate 105, wherein the continuous circuit trace contains least one circulator circuit trace 110. The first substrate 105 is made from a non-ferrous dielectric material, such as dielectric materials used for manufacturing printed circuit boards (PCBs). For instance, the first substrate 105 maybe made from PTFE, or a PTFE combined with glass, glass fibers, resin, ceramics, and the like. Typically, the first substrate 105 that carries the continuous circuit trace 110 is relatively thin. For instance, in an exemplary embodiment, the first substrate 105 has a thickness, $T_1$, in the range of approximately 0.003 inches and 0.007 inches and more preferably of approximately 0.005 inches.

The continuous circuit trace 110 may be deposited on the first substrate 105 using any conventional method known in the art. For example, the continuous circuit trace 110 may be deposited on the first substrate 105 by physical vapor deposition, also known as sputtering, chemical vapor deposition, electro deposition, lamination, and the like. Alternatively, one side of the first substrate 105 can contain cladding one side and the continuous circuit trace 110 can be etched using standard techniques. Designing the continuous circuit trace 110 provides several advantages over the circulator components used in conventional circulators. For instance, since the continuous circuit trace 110 resides on non-ferrous dielectric substrate, the continuous trace 110 of the circulator assembly 100 can be manufactured using conventional PCB techniques. Second, the non-ferrous dielectric is more durable than the ferrous substrates used in conventional circulators. Conventional ferrous substrates are typically made from ferrite or pressed from metallic powder, which tends to be brittle, easily broken, limited in size, expensive, and usually is not compatible with other RF components. Therefore, the use of materials commonly used for PCBs for the first substrate makes the circulator assembly 100 more robust than conventional circulators and therefore, is conducive to automated manufacturing.

At 1210, an aperture 125 is cut into the second substrate 120 at a position that will allow it to be proximately aligned with the circuit trace 110 when the second substrate 120 is bonded to the first substrate 105. The aperture 125 is bored completely through the second substrate 120 and the cladding 130. This "through-boring" process has several advantages over existing circulators. The aperture 125 avoids the problems associated with milling a recess in the substrate to small and precise tolerances, which are difficult to achieve, problematic, and expensive to manufacture.

At 1215, a stack is created by placing a second substrate 120 comprising a cladding layer 130 on at least one side below the first substrate 105. An adhesive material, such as bond film that is suitable for RF circuits is placed between the first substrate 105 and the second substrate 120. The second substrate 120 is also constructed from a non-ferrous dielectric material used for making PCBs. Typically, the second substrate 120 is made from the same material and has the same dielectric constant as the first substrate 105. However, those skilled in the art will appreciate that the second substrate 120 may be made from a different material and have a different dielectric constant than the first substrate 105. Furthermore, the second substrate 120 is made to have thickness, $T_2$, that is greater than the thickness of the first substrate 105. In one exemplary embodiment, the thickness $T_2$, of the second substrate 120 is between approximately 0.01 inches and 0.07 inches, and more preferably about 0.03 inches. At this time the stack, which consists of the fist substrate 105 and the second substrate 120 may be bonded tighter to form a circuit board laminate. Alternatively, the bonding process may be performed after all of the elements have been aligned and assembled.

The second substrate 120 contains an aperture 125 that is proximately aligned with the circuit trace 110 on the first substrate 105. The aperture 125 is typically circular in shape and has a diameter that encompasses the entire central resonator portion of the circulator circuit trace 110. A circular-shaped aperture 125 is preferred over other shapes, as a circular-shaped aperture 125 is easier and less expensive to manufacture than other shaped aperture. Although a circular-shaped aperture 125 is described as being more desirable, the aperture 125 may have any polygonal shape, such as a triangle, a square, a pentagon, a hexagon, a heptagon, an octagon, and the like.

At 1220, a ferrite element 135 is placed within the aperture 125 in the second substrate 120. The ferrite element 135 is typically formed in the shape of a disc, and has a thickness that is substantially equal to the thickness, $T_2$, of the second substrate 120. This allows the top of the ferrite element 135 to be coplanar with the top of the second substrate 120 and the bottom of the ferrite element 135 to be coplanar with the cladding 130 on the bottom of the second substrate 120. This prevents any discontinuities from forming within the circuit trace 110 due to unwanted flexing. The use of pre-drilled apertures 125 in the second substrate 120, which are proximately aligned with the circulator component 115, allows the ferrite element 135 to be "self aligning." Thus, the ferrite element 135 can be placed in the correct relationship relative to the circulator element 115 without the use of special alignment jigs or structures. Furthermore, since the alignment jigs are not longer required, the process of inserting the ferrite elements 135 can be automated using standard PCB manufacturing techniques.

At 1225, a conductive material 140 is placed across the aperture 125 and over the ferrite element 135 so that it is in electrical contact with the cladding layer 130. The conductive material 140, by being in electrical contact with the cladding 130 completes the ground plane for the circulator 100. Normally, the conductive layer 140 has a thickness in the range of approximately 0.003 inches and 0.007 inches. The thin conductive material provides a substantially planar ground plane, which is continuous across the aperture 125. The conductive layer 140 is typically made from a conductive tape, which not only completes the ground plane, but also supports the ferrite element 135 in the aperture 125 and is thermally stable over the operating temperatures of the circulator 100. Alternatively, the conductive material 140 may be made of a conductive adhesive, such as a two-part epoxy, and the like.

Next, at 1230, a magnet 150 is placed beneath the conductive layer 140 and in proximal alignment with the ferrite element 135. The magnet 155 is typically a permanent magnet and is bonded to the ferrite element with a conductive material 155. Typically, the conductive material is the same conductive tape used for the conductive material 140 disposed between the magnet 145 and the ferrite disc 135. The conductive material 140 may also be made from a conductive adhesive, and the like.

At 1235 a yoke 155 is placed below the magnet 145. A conductive material 150 is also disposed between the magnet 145 and the yoke 155 to allow the yoke 155 to be bonded to the magnet 150.

Finally, at 1240, the stack is laminated in a one-step process, also known as co-bonding. This co-bonding process of manufacturing can be applied to manufacturing at least one circulator with at least one RF component that share a common, continuous circuit trace, in which the various assembly components are laminated or joined together, in a single step, commonly referred to "co-bonded" or "co-bonding."

The method 1200 for manufacturing the circulator assembly 100 provides several advantages over existing methods. First, since the circulator assembly 100 uses standard dielectric materials commonly used in PCBs for the substrates, rather than ferrite substrates, the cost of manufacturing the circulator assembly is greatly reduced. Second, since the ferrite elements 135 are self aligning, the circulator assembly 100 can be assembled without the use of alignment jigs. Therefore, the circulator assembly 100 can be assembled using standard automated PCB manufacturing techniques. Furthermore, the method 1200 supports panel production practices, which allows large scale production of the circulator assemblies, which greatly reduces the overall cost of manufacturing the circulator assembly 100.

Other alternative embodiments will become apparent to those skilled in the art to which an exemplary embodiment pertains without departing from its spirit and scope. Accordingly, the scope of the present invention is defined by the appended claims rather than the foregoing description.

We claim:

1. A circulator assembly, comprising:
   a first substrate comprising a continuous circuit trace, the continuous circuit trace comprising at least one circulator component;
   a second substrate disposed below the first substrate, comprising:
      a cladding on at least one side;
      an aperture; and
      a ferrite element inserted into the aperture and proximately aligned with the circulator component;
   a conductive material disposed over the ferrite element of the second substrate and in electrical contact with the cladding of the second substrate forming a continuous ground plane; and
   a first magnet positioned below the ferrite element;
   wherein the first substrate comprises a first surface and a second surface, wherein the first surface comprises the continuous circuit trace and is disposed adjacent to the second substrate; and
   wherein the second surface of the first substrate comprises a cladding.

2. The circulator assembly of claim 1 further comprising a yoke disposed below the first magnet.

3. The circulator assembly of claim 1, wherein the first substrate comprises a non-ferrous dielectric material.

4. The circulator assembly of claim 1, wherein the second substrate comprises a dielectric material.

5. The circulator assembly of claim 1, wherein the conductive material comprises a conductive thin film adhesive.

6. The circulator assembly of claim 1, wherein the first substrate has a thickness in the range of approximately 0.003 inches to 0.007 inches and the second substrate has a thickness in the range of approximately 0.03 inches to 0.07 inches.

7. The circulator assembly of claim 1, wherein the first substrate has a thickness of approximately 0.005 inches and the second substrate has a thickness of approximately 0.05.

8. The circulator assembly of claim 1, further comprising:
   a third substrate located above the first substrate, the third substrate comprising:
      a cladding on at least one surface;
      an aperture; and
      a ferrite element disposed within the aperture and proximately aligned with the circulator component;
   a conductive material disposed above the ferrite disc and in electrical contact with the cladding of the third substrate forming a second continuous ground plane; and
   a second magnet positioned above the ferrite disc of the third substrate.

9. The circulator assembly of claim 8, further comprising a yoke.

10. The circulator assembly of claim 9, wherein the yoke comprises a top plate positioned above the second magnet and a bottom plate positioned below the first magnet.

11. The circulator assembly of claim 10, wherein the yoke further comprises at least one tang connecting the top plate and the bottom plate.

12. The circulator assembly of claim 8, wherein the conductive material comprises a conductive thin film adhesive.

* * * * *